United States Patent
Iiduka

(10) Patent No.: US 10,811,786 B2
(45) Date of Patent: Oct. 20, 2020

(54) HIGH-FREQUENCY MODULE

(71) Applicant: Murata Manufacturing Co., Ltd., Nagaokakyo-shi, Kyoto-fu (JP)

(72) Inventor: Masaki Iiduka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 106 days.

(21) Appl. No.: 16/043,190

(22) Filed: Jul. 24, 2018

(65) Prior Publication Data

US 2018/0331434 A1 Nov. 15, 2018

Related U.S. Application Data

(63) Continuation of application No. PCT/JP2017/003984, filed on Feb. 3, 2017.

(30) Foreign Application Priority Data

Feb. 5, 2016 (JP) .................. 2016-021290

(51) Int. Cl.
| | | |
|---|---|---|
| *H01Q 23/00* | (2006.01) | |
| *H01L 23/66* | (2006.01) | |
| *H03H 7/01* | (2006.01) | |
| *H04B 1/40* | (2015.01) | |
| *H04B 1/525* | (2015.01) | |
| *H04B 1/18* | (2006.01) | |
| *H04B 1/04* | (2006.01) | |

(Continued)

(52) U.S. Cl.
CPC .............. *H01Q 23/00* (2013.01); *H01L 23/66* (2013.01); *H03H 7/01* (2013.01); *H03H 7/0115* (2013.01); *H04B 1/0458* (2013.01); *H04B 1/18* (2013.01); *H04B 1/40* (2013.01); *H04B 1/525* (2013.01); *H01L 2223/6677* (2013.01); *H01Q 5/50* (2015.01); *H03H 7/38* (2013.01); *H04B 1/00* (2013.01)

(58) Field of Classification Search
CPC ........ H01Q 23/00; H01Q 5/50; H04B 1/0458; H04B 1/18; H04B 1/40; H04B 1/00; H03H 7/0115; H03H 7/01; H01L 23/66
USPC .......................................................... 343/876
See application file for complete search history.

(56) References Cited

U.S. PATENT DOCUMENTS

| | | | | |
|---|---|---|---|---|
| 8,466,733 B2* | 6/2013 | Uejima | ..................... | H03H 7/38 327/365 |
| 9,634,366 B2* | 4/2017 | Murase | ................ | H04B 1/0057 |

(Continued)

FOREIGN PATENT DOCUMENTS

| | | |
|---|---|---|
| JP | 2006-310968 A | 11/2006 |
| WO | 2015/098257 A1 | 7/2015 |
| WO | 2015/156079 A1 | 10/2015 |

OTHER PUBLICATIONS

Official Communication issued in International Patent Application No. PCT/JP2017/003984, dated Apr. 25, 2017.

*Primary Examiner* — Hai V Tran
(74) *Attorney, Agent, or Firm* — Keating & Bennett, LLP

(57) ABSTRACT

A high-frequency module includes a first switch circuit including a first common terminal, a second common terminal, and selection terminals, and selectively connecting the first common terminal and the second common terminal to selection terminals different from each other among the plurality of selection terminals, and a matching circuit to be connected to the second common terminal without being connected to an antenna.

19 Claims, 6 Drawing Sheets

(51) Int. Cl.
   *H03H 7/38*   (2006.01)
   *H04B 1/00*   (2006.01)
   *H01Q 5/50*   (2015.01)

(56) References Cited

U.S. PATENT DOCUMENTS

| | | | | |
|---|---|---|---|---|
| 2008/0211729 | A1* | 9/2008 | Eriksson | H01P 1/127 |
| | | | | 343/876 |
| 2011/0003566 | A1* | 1/2011 | Makihara | H01Q 23/00 |
| | | | | 455/127.1 |
| 2014/0097999 | A1* | 4/2014 | Murase | H04B 1/0057 |
| | | | | 343/860 |
| 2014/0203887 | A1* | 7/2014 | Murata | H03H 7/465 |
| | | | | 333/103 |
| 2014/0354508 | A1* | 12/2014 | Lee | H01Q 25/30 |
| | | | | 343/860 |
| 2015/0087254 | A1* | 3/2015 | Iwanaga | H04B 1/0458 |
| | | | | 455/248.1 |
| 2015/0295595 | A1* | 10/2015 | Uejima | H04B 7/04 |
| | | | | 455/78 |
| 2015/0341076 | A1* | 11/2015 | Uejima | H04B 1/3805 |
| | | | | 455/78 |
| 2016/0285490 | A1* | 9/2016 | Hanaoka | H04B 1/006 |
| 2017/0194940 | A1 | 7/2017 | Nurikabe et al. | |
| 2017/0264337 | A1* | 9/2017 | Kogure | H04B 1/525 |
| 2019/0220722 | A1* | 7/2019 | Matsubara | H04B 1/006 |
| 2019/0273528 | A1* | 9/2019 | Watanabe | H04B 1/00 |

* cited by examiner

HIGH-FREQUENCY MODULE

CROSS REFERENCE TO RELATED APPLICATIONS

This application claims the benefit of priority to Japanese Patent Application No. 2016-021290 filed on Feb. 5, 2016 and is a Continuation Application of PCT Application No. PCT/JP2017/003984 filed on Feb. 3, 2017. The entire contents of each application are hereby incorporated herein by reference.

BACKGROUND OF THE INVENTION

1. Field of the Invention

The present invention relates to a high-frequency module.

2. Description of the Related Art

In recent years, a high-frequency module that performs transmission and reception in a plurality of communication bands due to multiple bands of a communication device, such as a cellular phone, has been known. Such a high-frequency module is provided with a switch circuit including a common terminal connected to an antenna; and a plurality of selection terminals connected to a transmission system circuit or a reception system circuit (see, for example, International Publication No. 2015/156079). According to this configuration, the phase of a transmission signal is adjusted by providing a phase circuit on a transmission path connected to a selected terminal (selection terminal) of the switch IC (switch circuit). Thus, isolation between the transmission path on which the phase circuit is provided and a transmission path connected to another selected terminal is increased.

However, in this configuration, bandpass characteristics may deteriorate because of the presence of the phase circuit on a path for a high-frequency signal to be transmitted (that is, a transmission path).

In addition, the number of selection terminals provided in one switch circuit tends to increase with a further increase in multiple bands of a communication device. Thus, when the number of selection terminals is increased while the size of the switch circuit is prevented from increasing, isolation between the selection terminals may deteriorate due to the intervals between the selection terminals becoming narrow.

Isolation indicates the degree of isolation between any two points, and will be described below particularly as a degree of isolation between selection terminals.

SUMMARY OF THE INVENTION

Preferred embodiments of the present invention provide high-frequency modules that are able to increase isolation while reducing or preventing deterioration of bandpass characteristics.

A high-frequency module according to a preferred embodiment of the present invention includes a first switch circuit including a first common terminal, a second common terminal, and a plurality of selection terminals and selectively connecting the first common terminal and the second common terminal to selection terminals different from each other among the plurality of selection terminals; and a matching circuit to be connected to the second common terminal without being connected to an antenna.

By providing the matching circuit connected to the second common terminal of the first switch circuit described above, an unwanted signal leaking out through the selection terminal connected to the first common terminal is less likely to leak out of the first switch circuit through another selection terminal. Specifically, the unwanted signal leaking out to the selection terminal connected to the second common terminal is more likely to leak through the second common terminal connected to the matching circuit than through the selection terminal. As a result, since it is possible to reduce or prevent an unwanted signal from leaking out of the first switch circuit through the selection terminal, it is possible to increase isolation. In addition, the matching circuit is not connected to any of the one or more antennas. That is, since the matching circuit is provided on a path different from a path for a signal to be transmitted by the high-frequency module, deterioration of bandpass characteristics is less likely to be caused. As described above, the high-frequency module according to the present preferred embodiment is able to increase the isolation while reducing or preventing deterioration of the bandpass characteristics.

In addition, the matching circuit may be connected in series with the second common terminal.

In addition, the matching circuit may include a shunt-connection element provided between the second common terminal and a ground potential.

Since the matching circuit includes a shunt-connection element as described above, an unwanted signal leaking to the selection terminal connected to the second common terminal is likely to flow to the ground via the second common terminal and the matching circuit. Thus, since it is possible to reduce or prevent an unwanted signal leaking out of the first switch circuit through the selection terminal, it is possible to further increase the isolation.

In addition, the matching circuit may be a filter matching circuit having a pass band including a frequency band corresponding to a selection terminal to be connected to the first common terminal among the plurality of selection terminals.

Since the matching circuit is a filter matching circuit as described above, it is possible to reduce or prevent reflection of an unwanted signal leaking through the second common terminal to the matching circuit. Thus, it is possible to reduce or prevent an unwanted signal leaking out of the first switch circuit through the selection terminal connected to the second common terminal due to such reflection. Therefore, it is possible to further increase the isolation.

In addition, the matching circuit may be a low pass filter matching circuit.

Since the matching circuit is a low pass filter matching circuit as described above, it is possible to easily produce the high-frequency module even when a wide pass band is required for the matching circuit.

In addition, a first antenna connected to the first common terminal may be included.

Since the first antenna is included as described above, it is possible to achieve a high-frequency module that includes an antenna and that is able to increase isolation while reducing or preventing deterioration of bandpass characteristics.

In addition, a high-frequency module according to another preferred embodiment of the present invention includes a first switch circuit including a first common terminal, a second common terminal, and a plurality of selection terminals and selectively connecting the first common terminal and the second common terminal to selection terminals different from each other among the plurality of selection terminals; a second switch circuit including an input terminal, a first output terminal, and a second output terminal; and a matching circuit, the second common terminal is connected to the input terminal, the second switch circuit alternatively connects the input terminal to the first output terminal or the second output terminal, and the matching circuit is connected to the second output terminal.

Since the second switch circuit alternately connecting the second common terminal to the second antenna or the matching circuit is included as described above, it is possible to perform transmission and reception using both of the first antenna and the second antenna, for example, and apply to a carrier aggregation (CA) mode. Specifically, it is possible to increase the isolation, while reducing or preventing deterioration of the bandpass characteristics, during non-CA operation, and also CA operation in which the bandpass characteristics are good is possible.

In addition, preferred embodiments of the present invention may be combined with one another.

Moreover, a second antenna connected to the first output terminal may be included.

Preferred embodiments of the present invention provide high-frequency modules that are able to increase isolation while reducing or preventing deterioration of bandpass characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings. The preferred embodiments described below each illustrate a preferred specific example. Numerical values, shapes, materials, elements, the arrangement positions and the connection configuration of the elements, and other features described in the following preferred embodiments are merely examples, and are not intended to limit the present invention. In addition, among the elements in the following preferred embodiments, elements that are not described in the independent claim, which indicates the broadest concept of the present invention, are described as optional elements.

Preferred Embodiment 1

Figure 1:
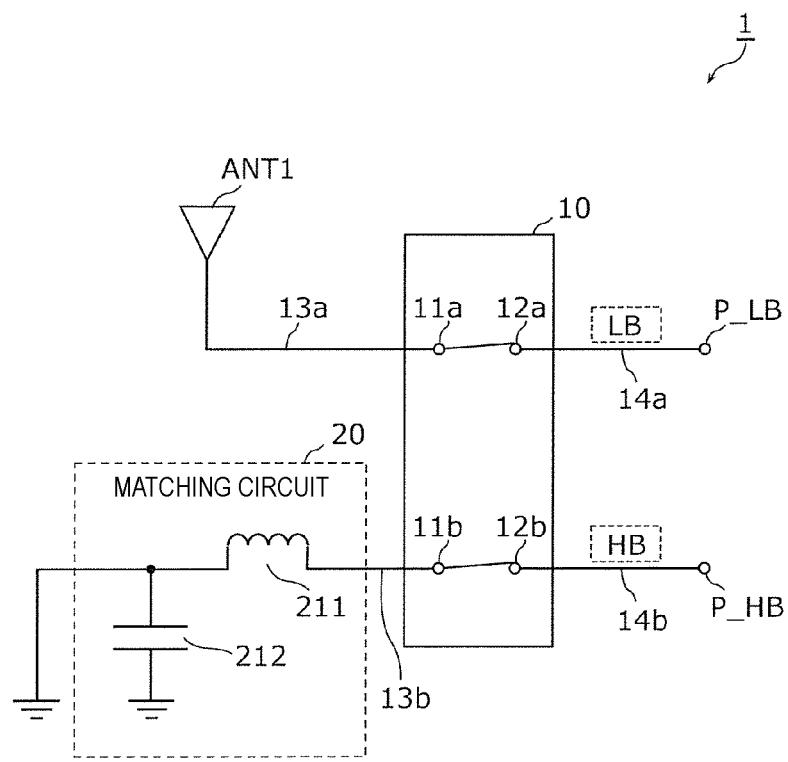
FIG. 1 is a circuit diagram of a high-frequency module according to Preferred Embodiment 1 of the present invention.

FIG. 1 is a circuit diagram of a high-frequency module 1 according to Preferred Embodiment 1 of the present invention.

The high-frequency module 1 shown in FIG. 1 is a high-frequency module that supports multiple bands, and is disposed at a front end of a communication device, such as a cellular phone, for example. The high-frequency module 1 is connected to a first antenna ANT1, and includes the first antenna ANT1 in the present preferred embodiment. The high-frequency module 1 may not include the first antenna ANT1.

The high-frequency module 1 transmits a high-frequency signal (a transmission signal or a reception signal) in a predetermined band of a plurality of bands, between the first antenna ANT1 and a signal processing circuit (not shown), such as an RFIC (radio frequency integrated circuit), for example, which processes the high-frequency signal.

In the present preferred embodiment, the high-frequency module 1 includes a LB band terminal P_LB to or from which a high-frequency signal in a low band (hereinafter, LB band) is input or output; and a HB band terminal P_HB to or from which a high-frequency signal in a high band (hereinafter, HB band) is input or output. The high-frequency module 1 selectively transmits a high-frequency signal between the first antenna ANT1 and the LB band terminal P_LB and between the first antenna ANT1 and the HB band terminal P_HB.

For example, the high-frequency module 1 preferably supports LTE (Long Term Evolution) and transmits a high-frequency signal in a Band (frequency band) specified by 3GPP (Third Generation Partnership Project). The high-frequency module 1 preferably transmits, for example, a high-frequency signal in Band8 (transmission band: about 880 MHz to about 915 MHz, reception band: about 925 MHz to about 960 MHz) as a high-frequency signal in the LB band, and transmits, for example, a high-frequency signal in Band1 (transmission band: about 1920 MHz to about 1980 MHz, reception band: about 2110 MHz to about 2170 MHz) as a high-frequency signal in the HB band.

Specifically, the high-frequency module 1 includes a first switch circuit 10 and a matching circuit 20 as shown in FIG. 1.

The first switch circuit 10 includes a first common terminal 11a connected to the first antenna ANT1, a second common terminal 11b not connected to the first antenna ANT1, and a plurality of selection terminals (here, two selection terminals 12a and 12b). For example, based on a control signal from the outside, the first switch circuit 10 selectively connects the first common terminal 11a and the second common terminal 11b to selection terminals different from each other among the plurality of selection terminals 12a and 12b. That is, the first common terminal 11a and the second common terminal 11b are exclusively connected to the plurality of selection terminals 12a and 12b.

The first common terminal 11a is connected to the first antenna ANT1 via a transmission path 13a and not connected to the matching circuit 20, and is connected to one of the selection terminals 12a and 12b based on a control signal, for example. The first common terminal 11a may be connected to the first antenna ANT1 via a matching circuit, a filter, or other suitable structure for the first antenna ANT1, which is different from the matching circuit 20.

The second common terminal 11b is connected to the matching circuit 20 via a transmission path 13b and not connected to the first antenna ANT1, and is connected to the other of the selection terminals 12a and 12b on the basis of a control signal, for example. The second common terminal 11b may be connected to an antenna different from the first antenna ANT1. That is, the high-frequency module 1 may be connected to a plurality of antennas including the first antenna ANT1.

The selection terminals 12a and 12b support bands different from each other in the present preferred embodiment, the selection terminal 12a supports the LB band (for example, Band8), and the selection terminal 12b supports the HB band (for example, Band1). Specifically, the selection terminal 12a is preferably connected to the LB band terminal P_LB via a transmission path 14a. In addition, the selection terminal 12b is preferably connected to the HB band terminal P_HB via a transmission path 14b. The bands supported by the selection terminals 12a and 12b, respectively, are not limited thereto. For example, the selection terminal 12a may support the HB band, and the selection terminal 12b may support the LB band. The selection terminals 12a and 12b may support the same band.

Such a first switch circuit 10 preferably includes a DPD (Double Pole Double Throw) high-frequency switch IC (Integrated Circuit), for example, in the present preferred embodiment, and defined by one chip, for example. In addition, various terminals (the first common terminal 11a, the second common terminal 11b, and the selection terminals 12a and 12b) of the first switch circuit 10 are preferably surface electrodes (pads) provided on an IC chip defining the first switch circuit 10, or wiring patterns connected to the surface electrodes, for example.

The matching circuit 20 is connected to the second common terminal 11b without being connected to any of one or more antennas including the first antenna ANT1. That is, in the present preferred embodiment, the matching circuit 20 is connected to the second common terminal 11b without being connected to the first antenna ANT1. As such, the matching circuit 20 is not connected to any antenna, and thus, is different from an antenna matching circuit.

Specifically, the matching circuit 20 is connected in series with the second common terminal 11b and reduces or prevents reflection of a high-frequency signal leaking through the second common terminal 11b to the transmission path 13b. For example, the matching circuit 20 provides matching between the impedance (output impedance) of the second common terminal 11b and the characteristic impedance (for example, about 50Ω) of the high-frequency module 1. In addition, for example, the matching circuit 20 may be provided such that the impedance obtained when the second common terminal 11b side is seen from the selection terminals 12a and 12b is lower than the impedance obtained when the LB band terminal P_LB and the HB band terminal P_HB side is seen from the selection terminals 12a and 12b.

More specifically, the matching circuit 20 is preferably, for example, a filter matching circuit that has a pass band including the frequency band corresponding to the selection terminal connected to the first common terminal 11a among the plurality of selection terminals 12a and 12b. In the present preferred embodiment, the first common terminal 11a is connectable to any of the plurality of selection terminals 12a and 12b, and thus, the matching circuit 20 includes both of the LB band and the HB band in the pass band thereof. In addition, in the present preferred embodiment, the matching circuit 20 is preferably a low pass filter matching circuit.

As shown in FIG. 1, the matching circuit 20 includes a shunt connection element (here, a capacitor 212) provided between the second common terminal 11b and a ground potential. Specifically, the matching circuit 20 includes an inductor 211 including an end connected to the second common terminal 11b, and the capacitor 212 including an end connected to the other end of the inductor 211 and another end connected to the ground potential. That is, the matching circuit 20 includes the inductor 211 connected in series with the transmission path 13b, and the capacitor 212 shunt-connected between the transmission path 13b and the ground potential.

The constants of the inductor 211 and the capacitor 212 are not particularly limited, and the pass band of a low pass filter defined by these components is determined as appropriate so as to include the above-described frequency band corresponding to the selection terminal connected to the first common terminal 11a. The circuit configuration of the matching circuit 20 is not limited thereto, and, for example, inductors connected in series with the transmission path 13b and capacitors shunt-connected to the transmission path 13b may be connected in multiple stages.

Such a matching circuit 20 is preferably, for example, a piezoelectric chip including a surface acoustic wave filter that uses a surface acoustic wave (SAW). The matching circuit 20 is not limited to the surface acoustic filter using SAW, and may be an acoustic wave filter using a bulk wave (BAW: bulk acoustic wave). In addition, the matching circuit 20 may be a filter including a combination of a chip inductor, a chip capacitor, and other suitable components, as appropriate.

In FIG. 1, the side (the left side in FIG. 1) of the matching circuit 20 opposite to the second common terminal 11b is connected to the ground potential. That is, the matching circuit 20 is illustrated to be inserted in the transmission path 13b which connects the second common terminal 11b and the ground potential, but is not limited thereto. For example, another element, such as an attenuator, may be provided at the side of the matching circuit 20 opposite to the second common terminal 11b.

The high-frequency module 1 according to the present preferred embodiment configured as described above operates as follows. Regarding operation of the high-frequency module 1 in the case of transmitting a high-frequency signal in the HB band, a connection relationship in the first switch circuit 10 is merely different from that in the case of transmitting a high-frequency signal in the LB band. Specifically, in the case of transmitting a high-frequency signal in the HB band, the first common terminal 11a is connected to the selection terminal 12b, and the second common terminal 11b is connected to the selection terminal 12a. Thus, regarding operation of the high-frequency module 1, the case of transmitting a high-frequency signal in the LB band will be described below, and the description of the case of transmitting a high-frequency signal in the HB band is omitted.

In the case in which the high-frequency module 1 transmits a high-frequency signal in the LB band, the first switch circuit 10 operates as follows based on a control signal input from a control circuit or other suitable circuit, for example.

Specifically, the first switch circuit 10 connects the first common terminal 11a to the selection terminal 12a supporting the LB band, and connects the second common terminal 11b to the selection terminal 12b supporting the HB band. Accordingly, a high-frequency signal (transmission signal) input through the LB band terminal P_LB passes through the first switch circuit 10 and is transmitted from the first antenna ANT1. In addition, a high-frequency signal (reception signal) input through the first antenna ANT1 passes through the first switch circuit 10 and is output from the LB band terminal P_LB.

As described above, the first switch circuit 10 connects the selection terminal 12a supporting a signal to be transmitted (here, a high-frequency signal in the LB band), to the first common terminal 11a connected to the first antenna ANT1. In addition, along with this, the first switch circuit 10 connects the selection terminal 12b supporting a signal not to be transmitted (here, a high-frequency signal in the HB band), to the second common terminal 11b connected to the matching circuit 20.

Figure 2:
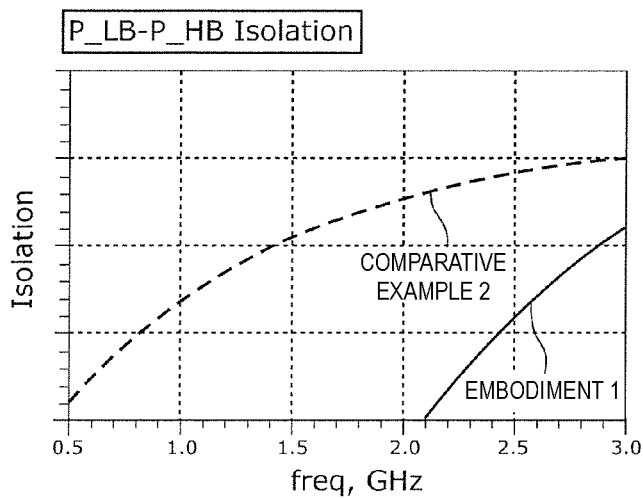
FIG. 2 is a graph showing isolation characteristics of the high-frequency module according to Preferred Embodiment 1 of the present invention.
Figure 3:
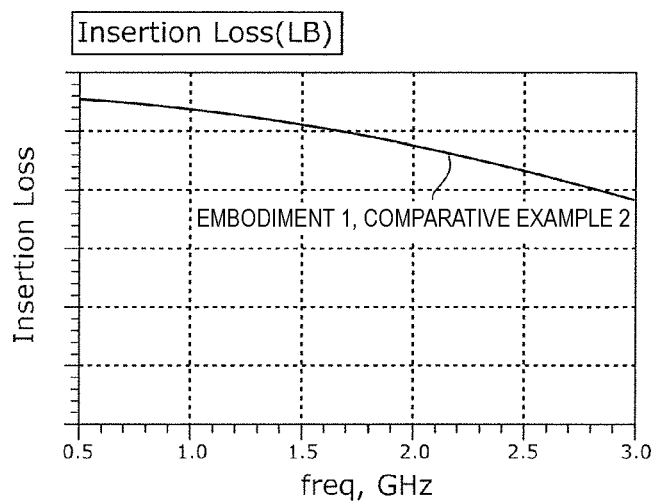
FIG. 3 is a graph showing bandpass characteristics of the high-frequency module according to Preferred Embodiment 1 of the present invention.

FIGS. 2 and 3 are graphs showing characteristics of the high-frequency module 1. Specifically, FIG. 2 is a graph showing isolation characteristics of the high-frequency module 1. FIG. 3 is a graph showing bandpass characteristics of the high-frequency module 1.

In these drawings, characteristics of Comparative Example 2 to be described later are shown together to clarify the advantageous effects achieved by the present preferred embodiment.

In FIG. 2, bandpass characteristics from the LB band terminal P_LB to the HB band terminal P_HB are shown as the isolation characteristics. That is, the vertical axis indicates the ratio (isolation) of the intensity of a signal observed at the HB band terminal P_HB relative to the intensity of a signal input through the LB band terminal P_LB. The horizontal axis indicates frequency, and the frequency of a frequency band including frequency band of the high-frequency module 1 (the band of the transmission signal or the band of the reception signal) is indicated.

In addition, in FIG. 3, insertion loss between the LB band terminal P_LB and the first antenna ANT1 is shown as the bandpass characteristics. That is, the vertical axis indicates the ratio (insertion loss) of the intensity of a signal observed at the input side of the first antenna ANT relative to the intensity of the transmission signal inputted through the LB band terminal P_LB. Similar to FIG. 2, the horizontal axis indicates frequency.

The bandpass characteristics of the high-frequency module 1 in the case of transmitting a high-frequency signal in the HB band correspond to the bandpass characteristics in the case in which a high-frequency signal in the HB band is input to the LB band terminal P_LB. Thus, the isolation characteristics described below also correspond to the bandpass characteristics from the HB band terminal P_HB to the LB band terminal P_LB in the case of transmitting a high-frequency signal in the HB band. Similarly, the bandpass characteristics described below also correspond to the bandpass characteristics from the HB band terminal P_HB to the first antenna ANT1 in the case of transmitting a high-frequency signal in the HB band.

The matters regarding the isolation characteristics and the bandpass characteristics are similarly applied to the following unless otherwise described.

The isolation characteristics and the bandpass characteristics shown in FIGS. 2 and 3 are better than those with a high-frequency module in which a SPDT switch circuit is used, instead of the DPDT first switch circuit 10. For easy understanding of this, a description will be provided using Comparative Example 1 as a reference.

Figure 4:
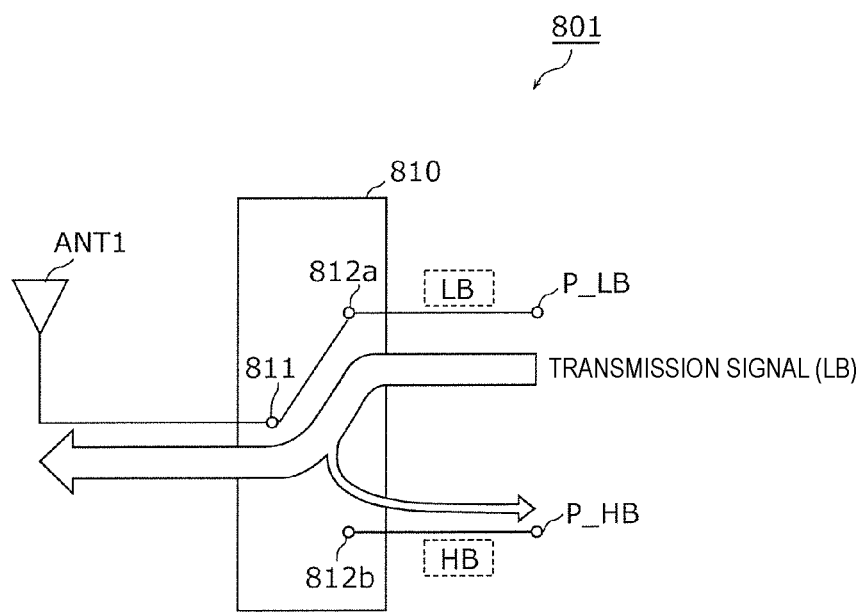
FIG. 4 is a circuit diagram of a high-frequency module according to Comparative Example 1 and illustrates a problem thereof.

FIG. 4 is a circuit diagram of a high-frequency module 801 according to Comparative Example 1 and illustrates a problem thereof.

The high-frequency module 801 according to Comparative Example 1 shown in FIG. 4 does not include the matching circuit 20 and includes a SPDT switch circuit 810, instead of the DPDT first switch circuit 10, as compared to the high-frequency module 1 according to the present preferred embodiment.

In the case of transmitting a transmission signal input through the LB band terminal P_LB, such a switch circuit 810 connects a common terminal 811 to a selection terminal 812a supporting the LB band, and a selection terminal 812b supporting the HB band is not connected to the common terminal 811.

Thus, in the high-frequency module 801 according to Comparative Example 1, when a transmission signal (unwanted signal) leaking through the selection terminal 812a leaks to the selection terminal 812b in the switch circuit 810, the unwanted signal may be output from the HB band terminal P_HB. That is, isolation characteristics as shown in FIG. 4 are produced.

Reduction or prevention of such an unwanted signal is particularly important for communication in LTE, or other communication systems, from the following reasons. Specifically, in the case in which the LB band terminal P_LB or the HB band terminal P_HB is connected to a circuit of a reception system via a duplexer or other suitable device, the circuit of the reception system is designed for a minute reception signal. Thus, when an unwanted signal leaks to the circuit of the reception system, a problem, such as deterioration of an element of the circuit, may arise.

Therefore, the configuration of Comparative Example 2 in which a DPDT switch circuit is provided, instead of the SPDT switch circuit 810, thus eliminating a selection terminal in an open state and reducing or preventing an unwanted signal, is conceivable.

Figure 5:
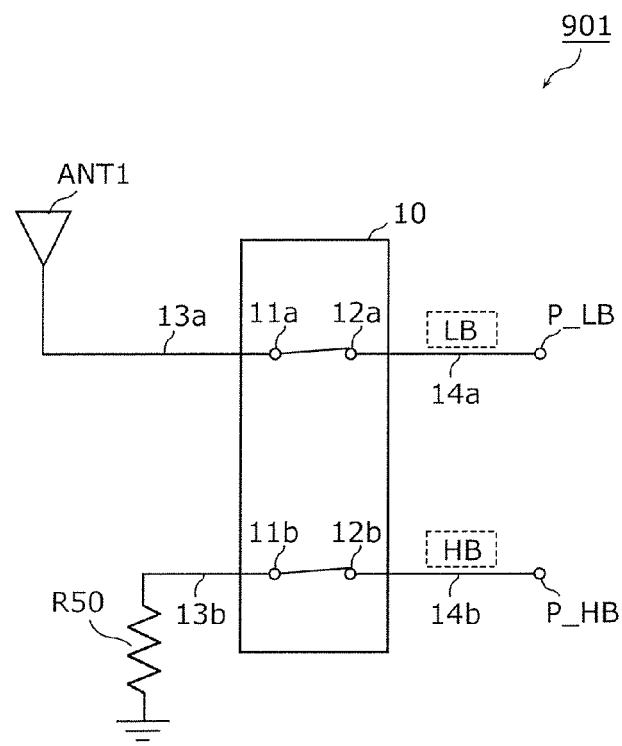
FIG. 5 is a circuit diagram showing the configuration of a high-frequency module according to Comparative Example 2.

FIG. 5 is a circuit diagram showing the configuration of a high-frequency module 901 according to Comparative Example 2.

The high-frequency module 901 shown in FIG. 5 includes the DPDT first switch circuit 10 similar to the high-frequency module 1 according to the above-described preferred embodiment, but is different from the high-frequency module 1 in that the second common terminal 11b is connected to the ground potential via a terminal resistor R50 having about 50Ω, instead of the matching circuit 20.

In the high-frequency module 901 according to Comparative Example 2 configured as described above, it is inferred to be able to increase the isolation as compared to Comparative Example 1. Specifically, even when a transmission signal leaking through the selection terminal 12a leaks to the selection terminal 12b in the first switch circuit 10, the transmission signal is less likely to be output from the HB band terminal P_HB by flowing to the ground potential via the second common terminal 11b connected to the selection terminal 12b.

The graphs indicated by Comparative Example 2 in FIGS. 2 and 3 are graphs showing isolation characteristics of the high-frequency module 901 according to Comparative Example 2.

As seen from FIG. 2, in the high-frequency module 1 according to the present preferred embodiment, the isolation is further increased as compared to that in the high-frequency module 901 according to Comparative Example 2.

This is determined as follows. Specifically, even in the case in which the second common terminal 11b is terminated by the terminal resistor R50, the impedance obtained when the second common terminal 11b side is seen from the selection terminal 12a may be higher than the impedance obtained when the HB band terminal P_HB side is seen from the selection terminal 12a. Thus, even when the second common terminal 11b is terminated, an unwanted signal is able to leak through the selection terminal 12a.

As seen from FIG. 3, in the high-frequency module 1 according to the present preferred embodiment, as compared to the high-frequency module 901 according to Comparative Example 2, deterioration of the bandpass characteristics is reduced or prevented, and specifically the bandpass characteristics are maintained. Here, "deterioration of the bandpass characteristics" means that the insertion loss increases (deteriorates). That is, "deterioration of the bandpass characteristics is reduced or prevented" means that the insertion loss is maintained or reduced (improved).

In other words, the high-frequency module 1 according to the present preferred embodiment is able to increase the isolation, while reducing or preventing deterioration of the bandpass characteristics, as compared to Comparative Example 1 and Comparative Example 2. The reason that such an advantageous effect is achieved will be described below with reference to FIG. 6.

Figure 6:
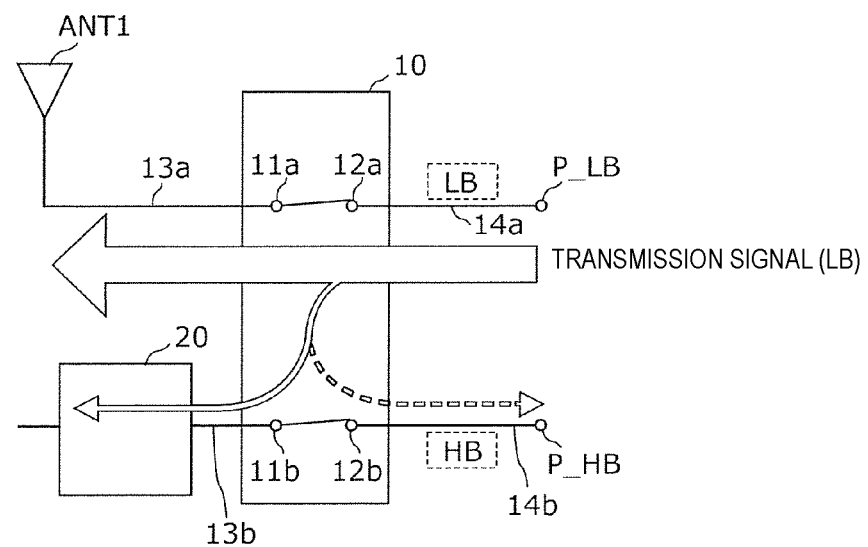
FIG. 6 is a diagram schematically showing a state in which a signal is propagated in the high-frequency module according to Preferred Embodiment 1 of the present invention.

FIG. 6 is a diagram schematically showing a state where a transmission signal propagates in the high-frequency module 1 according to the present preferred embodiment.

As shown in FIG. 6, for example, when a transmission signal in the LB band is input, the transmission signal in the LB band may leak out through the selection terminal 12a in the first switch circuit 10 and leak to the selection terminal 12b. For example, in the case in which the first switch circuit 10 is provided on a semiconductor substrate, such leaking of a signal is significant, since a signal is likely to leak via the semiconductor substrate. In addition, in the case in which the first switch circuit 10 is defined by an IC chip, such leaking of a signal is significant when the interval between the selection terminal 12a and the selection terminal 12b is decreased with size reduction of the IC chip. However, to reduce the size of the entire high-frequency module 1, it is preferable to provide the first switch circuit 10 on a semiconductor substrate into a chip.

Therefore, in the high-frequency module 1 according to the present preferred embodiment, since the matching circuit 20 connected to the second common terminal 11b of the first switch circuit 10 is provided, an unwanted signal (the transmission signal in the LB band in FIG. 6) leaking out through the selection terminal (the selection terminal 12a in FIG. 6) connected to the first common terminal 11a is less likely to leak out of the first switch circuit 10 through another selection terminal (the selection terminal 12b in FIG. 6). Specifically, the unwanted signal leaking out to the selection terminal connected to the second common terminal 11b is more likely to leak through the second common terminal 11b connected to the matching circuit 20 than through the selection terminal. As a result, since it is possible to reduce or prevent an unwanted signal from leaking out of the first switch circuit 10 through the selection terminal, it is possible to increase the isolation. In addition, the matching circuit 20 is not connected to any of the one or more antennas. That is, since the matching circuit 20 is provided on a path (the transmission path 13b in FIG. 6) different from a path for a signal to be transmitted by the high-frequency module 1 (the transmission paths 14a and 13a in FIG. 6), deterioration of the bandpass characteristics is less likely to occur. As described above, the high-frequency module 1 according to the present preferred embodiment is able to increase the isolation while reducing or preventing deterioration of the bandpass characteristics.

As a configuration to increase the isolation, a configuration in which one selection terminal among three or more selection terminals is connected to a ground potential directly or via a terminal resistor, is conceivable. In such a configuration, a portion of an unwanted signal leaking out through any other selection terminal flows to the ground via the one selection terminal in a switch circuit, and thus it is possible to increase the isolation from another selection terminal. However, with such a configuration, it is not possible to connect one selection terminal connected to the ground potential, to another selection terminal.

On the other hand, in the present preferred embodiment, the second common terminal 11b connected to the selection terminal is connected to the matching circuit 20. Accordingly, it is possible to further reduce or prevent an unwanted signal leaking out through the selection terminal, as compared to the above-described configuration.

In the high-frequency module 1 according to the present preferred embodiment, since the matching circuit 20 includes a shunt-connection element (the capacitor 212 in the present preferred embodiment), an unwanted signal leaking to the selection terminal connected to the second common terminal 11b is likely to flow to the ground via the second common terminal 11b and the matching circuit 20. Thus, since it is possible to reduce or prevent an unwanted signal leaking out of the first switch circuit through the selection terminal, it is possible to further increase the isolation.

In the high-frequency module 1 according to the present preferred embodiment, since the matching circuit 20 is preferably a filter matching circuit, it is possible to reduce or prevent reflection of an unwanted signal leaking through the second common terminal 11b to the matching circuit 20. Thus, it is possible to reduce or prevent an unwanted signal leaking out of the first switch circuit 10 through the selection terminal connected to the second common terminal 11b due to such reflection. Therefore, it is possible to further increase the isolation.

In the high-frequency module 1 according to the present preferred embodiment, the matching circuit 20 is preferably a low pass filter matching circuit, and thus it is possible to easily produce the high-frequency module even when a wide pass band is required for the matching circuit 20.

In the high-frequency module 1 according to the present preferred embodiment, the first antenna ANT1 is included, and thus, it is possible to obtain a high-frequency module that includes an antenna and that is able to increase isolation while reducing or preventing deterioration of bandpass characteristics.

Preferred Embodiment 2

Next, a high-frequency module according to Preferred Embodiment 2 of the present invention will be described.

Figure 7:
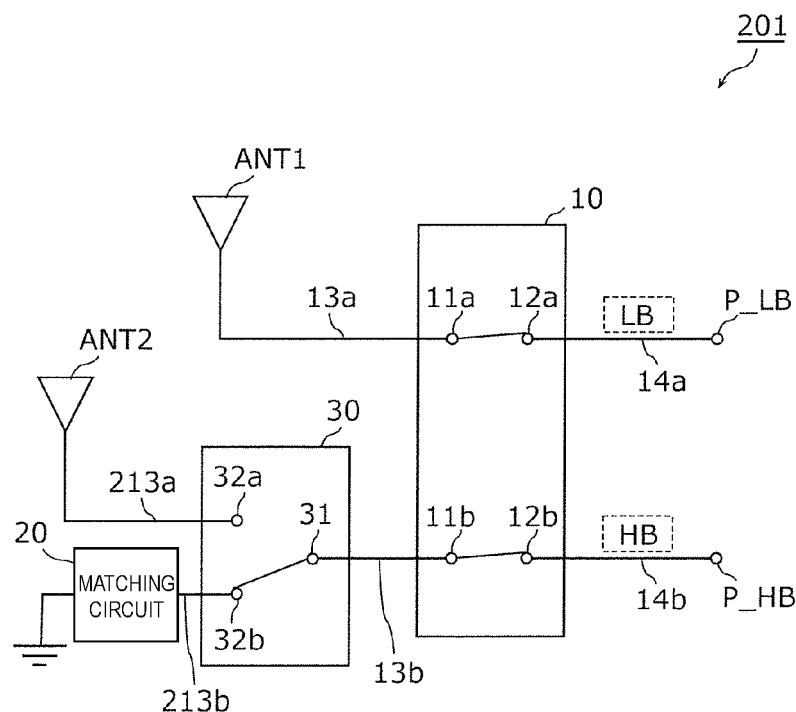
FIG. 7 is a circuit diagram of a high-frequency module according to Preferred Embodiment 2 of the present invention.

FIG. 7 is a circuit diagram of a high-frequency module 201 according to Preferred Embodiment 2 of the present invention.

The high-frequency module 201 shown in FIG. 7 is a high-frequency module connected to a plurality of antennas (two antennas in the present preferred embodiment, that is, a first antenna ANT1 and a second antenna ANT2) and includes the plurality of antennas. The high-frequency module 201 does not need to include at least one of the plurality of antennas.

As compared to the high-frequency module 1 according to Preferred Embodiment 1, the high-frequency module 201 according to the present preferred embodiment further includes a second switch circuit 30 which alternatively connects the second common terminal 11b to the second antenna ANT2 or the matching circuit 20.

The second switch circuit 30 includes an input terminal 31 and two output terminals 32a and 32b and alternatively connects the input terminal 31 to either one of the two output terminals 32a and 32b based on a control signal from the outside, for example.

Such a second switch circuit 30 preferably includes, for example, a SPDT (Single Pole Double Throw) high-frequency switch IC (Integrated Circuit), and is provided in one chip, for example.

The input terminal 31 is connected to the matching circuit 20 via the transmission path 13b, and is connected to only one of the output terminals 32a and 32b based on a control signal, for example. The output terminal 32a is a first output terminal connected to the second antenna ANT2 via a transmission path 213a. The output terminal 32b is a second output terminal connected to the matching circuit 20 via a transmission path 213b.

That is, similar to Preferred Embodiment 1, the matching circuit 20 is connected to the second common terminal 11b without being connected to any of one or more antennas (here, two antennas) to which the high-frequency module 201 is connected. Specifically, the matching circuit 20 is connected to the output terminal 32b (second output terminal). More specifically, the matching circuit 20 is connected in series with the output terminal 32b.

As compared to the high-frequency module 1 according to Preferred Embodiment 1, the high-frequency module 201 according to the present preferred embodiment performs transmission and reception by using both of the first antenna ANT1 and the second antenna ANT2, for example, is able to support a carrier aggregation mode (CA mode).

The high-frequency module 201 according to the present preferred embodiment operates as follows.

First, the case in which the high-frequency module 201 operates using only one of a plurality of frequency bands (non-CA operation) will be described.

In the case in which the high-frequency module 201 transmits a high-frequency signal in the LB band, the first switch circuit 10 operates in a manner similar to that in Preferred Embodiment 1. That is, the first switch circuit 10 connects the first common terminal 11a to the selection terminal 12a supporting the LB band, and connects the second common terminal 11b to the selection terminal 12b supporting the HB band.

In this case, the second switch circuit 30 connects the input terminal 31 to the output terminal 32b.

Figure 8:
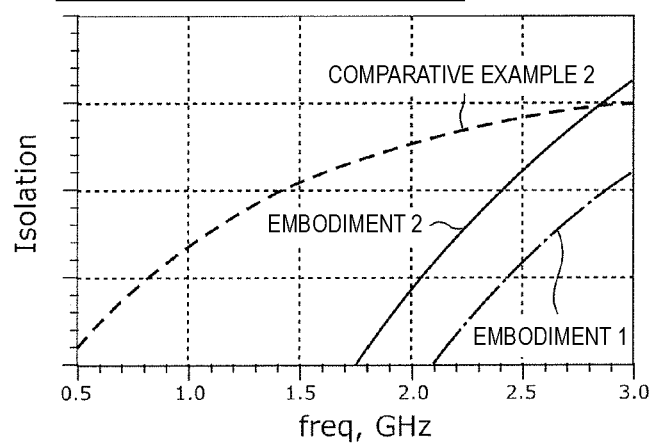
FIG. 8 is a graph showing isolation characteristics during non-CA operation of the high-frequency module according to Preferred Embodiment 2 of the present invention.
Figure 9:
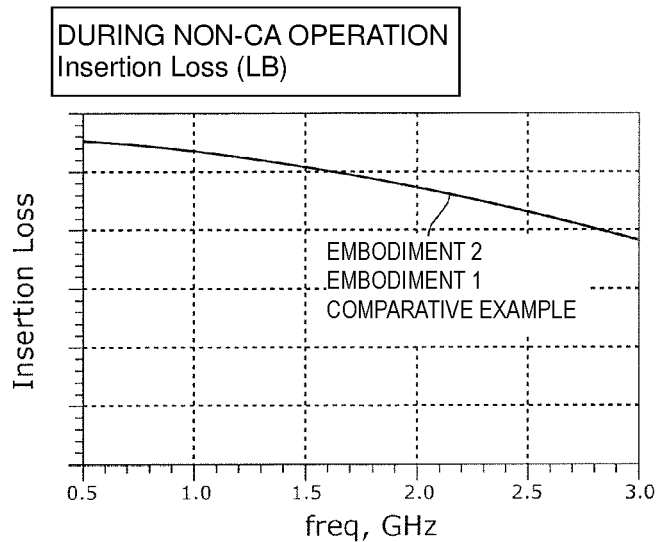
FIG. 9 is a graph showing bandpass characteristics during non-CA operation of the high-frequency module according to Preferred Embodiment 2 of the present invention.

FIGS. 8 and 9 are graphs showing characteristics of the high-frequency module 201 at this time. Specifically, FIG. 8 is a graph showing isolation characteristics during non-CA operation of the high-frequency module 201. FIG. 9 is a graph showing bandpass characteristics during non-CA operation of the high-frequency module 201. In FIGS. 8 and 9, as a reference, the isolation characteristics and the bandpass characteristics of Preferred Embodiment 1 and Comparative Example 2 shown in FIGS. 2 and 3 are also shown.

As seen from FIG. 8, in the high-frequency module 201 according to the present preferred embodiment, isolation is ensured to the same or almost the same degree as in the high-frequency module 1 according to Preferred Embodiment 1. That is, in the high-frequency module 201 according to the present preferred embodiment, the isolation is further increased as compared to that in the high-frequency module 901 according to Comparative Example 2.

As seen from FIG. 9, in the high-frequency module 201 according to the present preferred embodiment, bandpass characteristics are maintained to the same or almost the same degree as in the high-frequency module 1 according to Preferred Embodiment 1. That is, in the high-frequency module 201 according to the present preferred embodiment, as compared to the high-frequency module 901 according to Comparative Example 2, deterioration of the bandpass characteristics is reduced or prevented, and specifically, the bandpass characteristics are maintained.

In other words, in the case in which the high-frequency module 201 according to the present preferred embodiment transmits a high-frequency signal in the LB band, the connection relationship between the first antenna ANT1, the matching circuit 20, the LB band terminal P_LB, and the HB band terminal P_HB is the same or substantially the same as that in the high-frequency module 1 according to Preferred Embodiment 1, due to the above-described operation. Thus, during non-CA operation, the high-frequency module 201 is able to increase the isolation while reducing or preventing deterioration of the bandpass characteristics.

Next, the case in which the high-frequency module 201 operates using two or more frequency bands among the plurality of frequency bands (CA operation) will be described.

In the case in which the high-frequency module 201 transmits high-frequency signals in both the LB band and the HB band, the first switch circuit 10 operates in a manner similar to that in Preferred Embodiment 1. That is, the first switch circuit 10 connects the first common terminal 11a to the selection terminal 12a supporting the LB band, and connects the second common terminal 11b to the selection terminal 12b supporting the HB band.

The connection relationship of the first switch circuit is not limited thereto, and, for example, the first switch circuit 10 may connect the first common terminal 11a to the selection terminal 12b and connect the second common terminal 11b to the selection terminal 12a in consideration of the characteristics of the first antenna ANT1 and the second antenna ANT2.

In this case, the second switch circuit 30 connects the input terminal 31 to the output terminal 32a.

Figure 10:
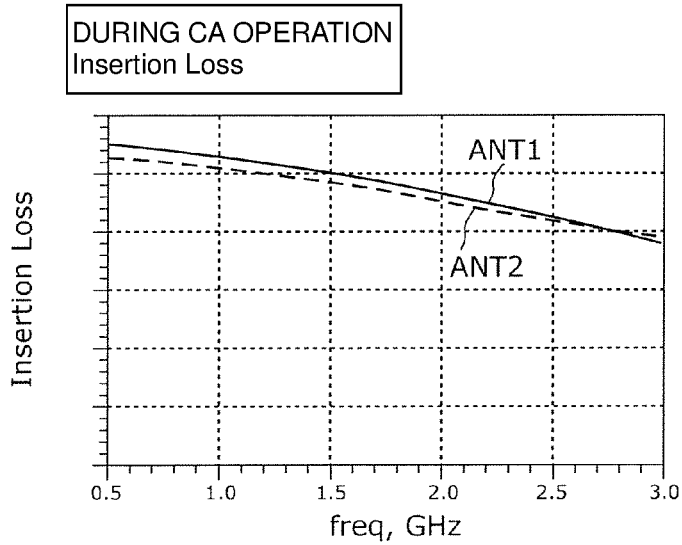
FIG. 10 is a graph showing bandpass characteristics regarding a first antenna and a second antenna during CA operation of the high-frequency module according to Preferred Embodiment 2 of the present invention.

FIG. 10 is a graph showing characteristics of the high-frequency module 201 at this time. Specifically, FIG. 10 is a graph showing bandpass characteristics regarding the first antenna ANT1 and the second antenna ANT2 during CA operation of the high-frequency module 201.

In the graph indicated by ANT1 in FIG. 10, bandpass characteristics from the LB band terminal P_LB to the first antenna ANT1 are shown as bandpass characteristics. That is, in the graph indicated by ANT1, insertion loss on a transmission path that does not pass through the second switch circuit 30 is shown. In addition, in the graph indicated by ANT2 in FIG. 10, bandpass characteristics from the HB band terminal P_HB to the second antenna ANT2 are shown as bandpass characteristics. That is, in the graph indicated by ANT2, insertion loss on the transmission path that passes through the second switch circuit 30 is shown.

As seen from a comparison between FIG. 9 and FIG. 10, in the high-frequency module 201 according to the present preferred embodiment, even during CA operation, on the transmission path that does not pass through the second switch circuit 30, bandpass characteristics are maintained to the same or almost the same degree as those during non-CA operation.

As seen from a comparison between the two graphs in FIG. 10, in the high-frequency module 201 according to the present preferred embodiment, even on a transmission path that passes through the second switch circuit 30, bandpass characteristics are maintained to the same or almost the same degree as those on the transmission path that does not pass through the second switch circuit 30.

As described above, in the high-frequency module 201 according to the present preferred embodiment, during non-CA operation, similar to Preferred Embodiment 1, the matching circuit 20 is connected to the second common terminal 11*b*. Therefore, similar to Preferred Embodiment 1, during non-CA operation, the high-frequency module 201 according to the present preferred embodiment is able to increase the isolation while reducing or preventing deterioration of the bandpass characteristics.

According to the present preferred embodiment, since the second switch circuit, which alternatively connects the second common terminal to the second antenna or the matching circuit, is included, it is possible to perform transmission and reception using both of the first antenna and the second antenna, for example, in the CA mode. That is, it is possible to increase isolation, while reducing or preventing deterioration of bandpass characteristics, during non-CA operation, and CA operation is also possible.

In particular, since an IC or other suitable device having good bandpass characteristics (less insertion loss) from the input terminal 31 to the output terminal 32*a* is used as the second switch circuit 30 in the high-frequency module 201, it is possible to transmit each of high-frequency signals in a plurality of frequency bands at low loss during CA operation.

Modification of Preferred Embodiment 2

In Preferred Embodiment 2 described above, the first switch circuit 10 is preferably a DPDT switch circuit. That is, the first common terminal 11*a* is connected to any one of the plurality of selection terminals 12*a* and 12*b*, and the second common terminal 11*b* is connected to any one selection terminal to which the first common terminal 11*a* is not connected, among the plurality of selection terminals 12*a* and 12*b*.

However, the first switch circuit 10 may be defined by, for example, a combination of a SPnT (Single Pole n Throw; n is the number of LB band terminals P_LB) switch circuit for the LB band and a SPnT (n is the number of HB band terminals P_HB) switch circuit for the HB band.

Figure 11:
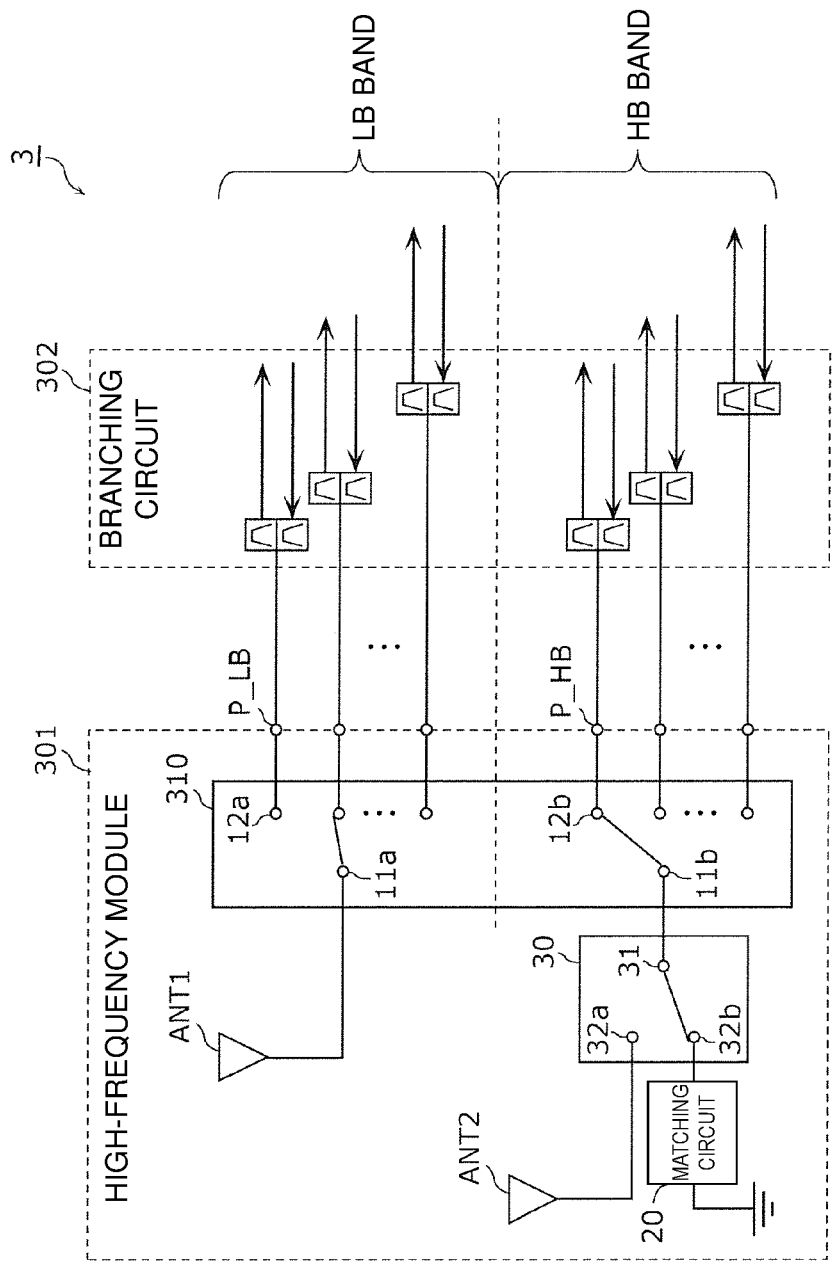
FIG. 11 is a circuit diagram of a high-frequency module according to a modification of Preferred Embodiment 2 of the present invention.

FIG. 11 is a circuit diagram of a high-frequency module 301 according to a modification of Preferred Embodiment 2 of the present invention. In FIG. 11, a branching circuit 302 which defines, for example, a portion of a front end module 3 of a communication device is shown together with the high-frequency module 301.

For example, the front end module 3 shown in FIG. 11 preferably complies with a communication standard, such as LTE, and transmits high-frequency signals in a plurality of bands that belong to the LB band and high-frequency signals in a plurality of bands that belong to the HB band. The high-frequency signal in each band is split (branched) into a transmission signal and a reception signal by the branching circuit 302 which is composed includes, for example, a duplexer or other suitable circuit.

A first switch circuit 310 includes a combination of: a SPnT switch circuit including a first common terminal 11*a* and a plurality of selection terminals 12*a* supporting the LB band; and a SPnT switch circuit including a second common terminal 11*b* and a plurality of selection terminals 12*b* supporting the HB band. That is, the first common terminal 11*a* is not connected to any of the plurality of selection terminals 12*b* supporting the HB band, and the second common terminal 11*b* is not connected to any of the plurality of selection terminals 12*a* supporting the LB band.

Such a high-frequency module 301 operates as follows, for example. The second switch circuit 30 operates in a manner similar to that in Preferred Embodiment 2, and thus the description of operation of the second switch circuit 30 is omitted.

During non-CA operation, the first switch circuit 310 connects the first common terminal 11*a* to the selection terminal 12*a* supporting a transmission target band among the plurality of selection terminals 12*a* supporting the LB band. Along with this, the first switch circuit 310 connects the second common terminal 11*b* to any of the plurality of selection terminals 12*b* supporting the HB band. At this time, the selection terminal 12*b* to be connected to the second common terminal 11*b* is not particularly limited, but is, for example, the selection terminal 12*b* supporting a band in which a problem is likely to occur when a transmission signal in the transmission target band leaks.

During CA operation, the first switch circuit 310 connects the first common terminal 11*a* to the selection terminal 12*a* supporting a transmission target band among the plurality of selection terminals 12*a* supporting the LB band. Along with this, the first switch circuit 310 connects the second common terminal 11*b* to the selection terminal 12*b* supporting a transmission target band among the plurality of selection terminals 12*b* supporting the HB band.

Even in such a high-frequency module 301 according to the modification of Preferred Embodiment 2, during non-CA operation, similar to Preferred Embodiment 1, the matching circuit 20 is connected to the second common terminal 11*b*. Therefore, during non-CA operation, it is possible to increase the isolation between the LB band terminal P_LB supporting a transmission target band and the HB band terminal P_HB connected to the second common terminal 11*b* while maintaining bandpass characteristics in the transmission target band.

Although the high-frequency modules according to the preferred embodiments of the present invention and the modifications thereof have been described above, the present invention is not limited to the respective preferred embodiments and the modifications thereof. Various modifications to the preferred embodiments and the modifications thereof that are able to be conceived by those skilled in the art, and combinations of elements in different preferred embodiments and modifications thereof without departing from the gist of the present invention may be included in the scope of the present invention.

For example, in Preferred Embodiment 1 described above, the first switch circuit 10 has been described as a DPDT switch circuit. However, the configuration of the first switch circuit 10 is not limited thereto, and the first switch circuit 10 may be, for example, a DPnT (Double Pole n Throw; n is the number of bands) switch circuit.

In Preferred Embodiment 1 described above, the high-frequency module 1 is connected to one antenna (the first antenna ANT1 in Preferred Embodiment 1). However, the high-frequency module 1 may be connected to m antennas, the number of which is greater than or equal to 2. Thus, the first switch circuit 10 may be, for example, a nPnT (n Pole n Throw; "n" in nP is greater than or equal to m+1) switch circuit or a nPDT (n Pole Double Throw; "n" in nP is greater than or equal to m+1) switch circuit.

In the description above, the first common terminal 11a is connected to any one of a plurality of selection terminals, and the second common terminal 11b is connected to any other one of the plurality of selection terminals. However, the first common terminal 11a and the second common terminal 11b only need to be exclusively connected to a plurality of selection terminals, and at least one of the first common terminal 11a and the second common terminal 11b may be simultaneously connected to two or more selection terminals among three or more selection terminals.

In the description above, the matching circuit 20 includes a shunt-connection element, but may have a configuration that does not include such an element.

In the description above, the matching circuit 20 is a low pass filter matching circuit. However, the configuration of the matching circuit is not limited thereto, and the matching circuit may be, for example, a band pass filter or high pass filter matching circuit. In addition, the matching circuit 20 is not limited to the filter matching circuit, and may have a configuration that provides matching with, for example, a variable transfer device that adjusts a phase.

The high-frequency module described above does not have to transmit both a transmission signal and a reception signal, and may transmit only either a transmission signal or a reception signal. Alternatively, the high-frequency module may transmit only transmission signals in a band among a plurality of bands, and may transmit at least reception signals in another band.

Preferred embodiments of the present invention may be widely used as a high-frequency module supporting multi-band feature in communication devices, such as a cellular phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a first switch circuit including a first common terminal, a second common terminal, and a plurality of selection terminals, to selectively connect the first common terminal and the second common terminal to selection terminals different from each other among the plurality of selection terminals; and
a matching circuit to be connected to the second common terminal without being connected to an antenna.

2. The high-frequency module according to claim 1, wherein the matching circuit is connected in series with the second common terminal.

3. The high-frequency module according to claim 1, wherein the matching circuit includes a shunt-connection element provided between the second common terminal and a ground potential.

4. The high-frequency module according to claim 3, wherein the shunt-connection element is a capacitor.

5. The high-frequency module according to claim 4, wherein
the matching circuit includes an inductor;
the inductor includes a first end connected to the second common terminal; and
the capacitor includes a first end connected to a second end of the inductor and a second end connected to the ground potential.

6. The high-frequency module according to claim 1, wherein the matching circuit is a filter matching circuit having a pass band including a frequency band corresponding to a selection terminal to be connected to the first common terminal among the plurality of selection terminals.

7. The high-frequency module according to claim 6, wherein the matching circuit is a low pass filter matching circuit.

8. The high-frequency module according to claim 1, further comprising a first antenna connected to the first common terminal.

9. The high-frequency module according to claim 1, wherein the first switch circuit includes a Double Pole Double Throw high-frequency switch IC.

10. A high-frequency module comprising:
a first switch circuit including a first common terminal, a second common terminal, and a plurality of selection terminals, to selectively connect the first common terminal and the second common terminal to selection terminals different from each other among the plurality of selection terminals;
a second switch circuit including an input terminal, a first output terminal, and a second output terminal; and
a matching circuit; wherein
the second common terminal is connected to the input terminal;
the second switch circuit alternatively connects the input terminal to the first output terminal or the second output terminal; and
the matching circuit is connected to the second output terminal.

11. The high-frequency module according to claim 10, wherein the matching circuit is connected in series with the second output terminal.

12. The high-frequency module according to claim 11, wherein the matching circuit includes a shunt-connection element provided between the second output terminal and a ground potential.

13. The high-frequency module according to claim 12, wherein the shunt-connection element is a capacitor.

14. The high-frequency module according to claim 13, wherein the matching circuit includes an inductor;
the inductor includes a first end connected to the second common terminal; and
the capacitor includes a first end connected to a second end of the inductor and a second end connected to the ground potential.

15. The high-frequency module according to claim 10, wherein the matching circuit is a filter matching circuit having a pass band including a frequency band corresponding to a selection terminal to be connected to the first common terminal among the plurality of selection terminals.

16. The high-frequency module according to claim 15, wherein the matching circuit is a low pass filter matching circuit.

17. The high-frequency module according to claim 10, further comprising a first antenna connected to the first common terminal.

18. The high-frequency module according to claim 10, further comprising a second antenna connected to the first output terminal.

19. The high-frequency module according to claim 10, wherein the first switch circuit includes a Double Pole Double Throw high-frequency switch IC.

* * * * *